(12) United States Patent
Luo et al.

(10) Patent No.: US 8,742,830 B2
(45) Date of Patent: Jun. 3, 2014

(54) FUSE SENSING CIRCUITS

(75) Inventors: Zhihong Luo, Singapore (SG); On Au Yeung, Singapore (SG); Benjamin Lau, Singapore (SG)

(73) Assignee: Globalfoundries Singapore Pte. Ltd., Singapore (SG)

(*) Notice: Subject to any disclaimer, the term of this patent is extended or adjusted under 35 U.S.C. 154(b) by 36 days.

(21) Appl. No.: 13/552,799

(22) Filed: Jul. 19, 2012

(65) Prior Publication Data

US 2014/0022004 A1   Jan. 23, 2014

(51) Int. Cl.
  *H01H 37/76*   (2006.01)
(52) U.S. Cl.
  USPC ........................... 327/525; 365/225.7
(58) Field of Classification Search
  USPC ........................... 327/525; 365/255.7
  See application file for complete search history.

(56) References Cited

U.S. PATENT DOCUMENTS

| | | | | |
|---|---|---|---|---|
| 5,943,281 A * | 8/1999 | Izumi | ............... | 365/225.7 |
| 6,545,526 B2 * | 4/2003 | Honigschmid | ............... | 327/525 |
| 6,933,742 B2 * | 8/2005 | Wallstab | ............... | 326/8 |
| 7,002,861 B2 * | 2/2006 | Kuo | ............... | 365/203 |
| 7,117,382 B2 * | 10/2006 | Khieu et al. | ............... | 713/401 |
| 7,119,596 B2 * | 10/2006 | Kong et al. | ............... | 327/261 |
| 7,215,175 B1 | 5/2007 | Mandal et al. | | |
| 7,224,633 B1 | 5/2007 | Hovis et al. | | |
| 7,304,527 B1 | 12/2007 | Guzman et al. | | |
| 7,388,775 B2 * | 6/2008 | Bedeschi et al. | ............... | 365/163 |
| 7,417,913 B2 | 8/2008 | Chen et al. | | |
| 7,477,555 B2 * | 1/2009 | Anand et al. | ............... | 365/196 |
| 7,514,982 B2 * | 4/2009 | Warner | ............... | 327/525 |
| 7,902,903 B2 | 3/2011 | Rosik et al. | | |
| 8,203,899 B2 * | 6/2012 | Chen et al. | ............... | 365/207 |
| 2008/0219038 A1 * | 9/2008 | Shuto | ............... | 365/145 |
| 2009/0161470 A1 * | 6/2009 | Kimmels | ............... | 365/225.7 |
| 2012/0075006 A1 * | 3/2012 | Vu et al. | ............... | 327/525 |

* cited by examiner

*Primary Examiner* — Thomas J Hiltunen
(74) *Attorney, Agent, or Firm* — Ditthavong Mori & Steiner, P.C.

(57) ABSTRACT

A fuse sensing circuit is disclosed. Embodiments include: providing a sense input terminal; providing a sense output terminal; and providing first and second capacitors that are configured to charge and discharge based on the sense input terminal, wherein the first and second capacitors are further configured to discharge current to a fuse unit cell, and the sense output terminal is configured to indicate a fuse state of the fuse unit cell based on the discharging of the first and second capacitors. Embodiments include the indicated fuse state being based on a discharge rate difference between the discharging of the first capacitor and the discharging of the second capacitor.

17 Claims, 3 Drawing Sheets

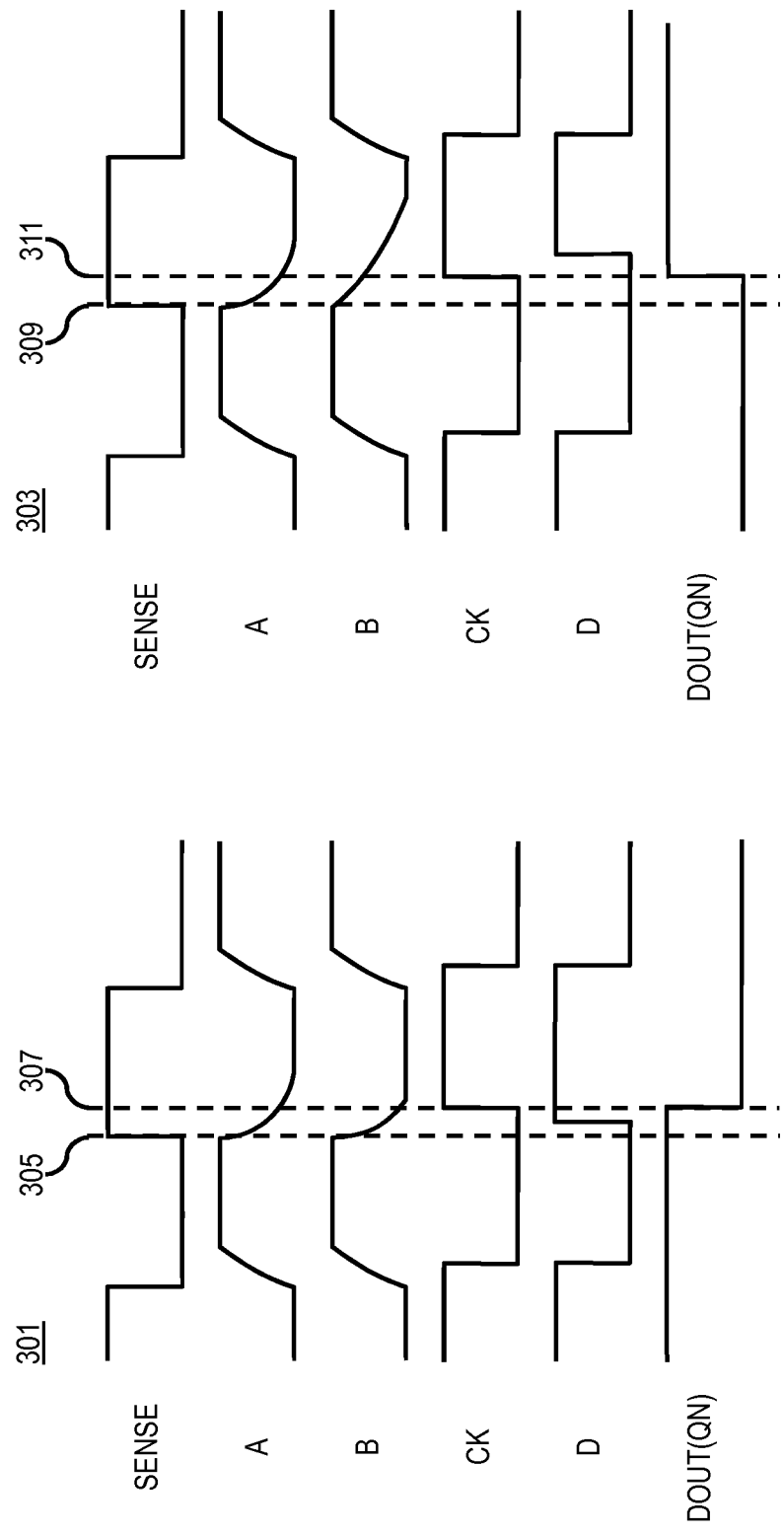

FUSE SENSING CIRCUITS

TECHNICAL FIELD

The present disclosure relates to fuse sensing circuits. The present disclosure is particularly applicable to electronic fuse (eFuse) sensing circuits.

BACKGROUND

FIG. 1 schematically illustrates a traditional sensing circuit with an eFuse unit cell. As shown, the circuit in FIG. 1 includes eFuse unit cell 101 connected to sensing circuit 103. eFuse unit cell 101 includes fuse 105 having one end coupled to a source (e.g., FSOURCE) and another end coupled to program transistor 107. While program transistor 107 is activated (e.g., based on inputs, FU_ROW_PG and FU_CLM_PG, to AND gate 109), a large current from FSOURCE may go through eFuse unit cell 101, causing fuse 105 to become blown. To detect the fuse state (e.g., blown, unblown, etc.) of fuse 105, eFuse unit cell 101 includes reference resistor 111 along with transistors 113 and 115 that are connected to sensing circuit 103.

Sensing circuit 103 includes inverters 117a through 117e and NAND gate 119. As depicted, the various outputs (e.g., SSW_N, SRES_P, SET_P11, SET_N11, SET_P22, SET_N22, etc.) of inverters 117a through 117e and NAND gate 119 act as switches for transistors within sensing circuit 103. For example, when transistors 113 and 115 are enabled (e.g., by FU_ROW_RD), and PRCHG is high, the two pre-charge paths from a power rail (e.g., VDD) to a ground rail (e.g., during such a situation, FSOURCE may be coupled to a ground rail) may be activated. The first path may, for instance, include transistor 121, transistor 123, transistor 113, and fuse 105, and the second path may include transistor 125, transistor 127, transistor 115, and reference resistor 111. The resistance of reference resistor 111 is greater than the resistance of unblown fuse 105, and less than that of blown fuse 105. If fuse 105 is unblown, the voltage at the node between transistors 129 and 131 (e.g., node A) will be less than the voltage at the node between transistors 133 and 135 (e.g., node B); if fuse 105 is blown, the voltage at the node between transistors 129 and 131 (e.g., node A) will be greater than the voltage at the node between transistors 133 and 135 (e.g., node B). Transistors 129, 131, 133, and 135 are two back-to-back inverter pairs that make up a latch (e.g., that is coupled to transistors 137 and 139). When SENSE is enabled, the initial voltage difference between nodes A and B will cause the latch to fix to a certain state after becoming balanced, and provide a DOUT signal (e.g., through inverter 141, pass-gate 143, and inverters 145, 147, and 149).

In order for the latch to provide an accurate fuse state of eFuse unit cell 101, the initial voltage difference between nodes A and B typically must be large enough for detection. However, because of variations of process, voltage, temperature, etc., the sense margin is difficult to tune for each process. Although the sense margin may be increased to make up for such variations, an increase in the sense margin will result in an increase in the current for the PRCHG and SENSE inputs, causing power consumption of sensing circuit 103 to be very high. In addition, the back-to-back inverter latch sense scheme and the two-stage sense procedure requiring a pre-charge before reading out data utilizes additional pins (e.g., PRCHG pins) and results in a very long read cycle time.

A need therefore exists for a more efficient and effective fuse sensing circuit that consumes less power, does not require additional pre-charge pins, avoids unnecessary pre-charging, and has faster read cycle speeds, and enabling methodology.

SUMMARY

An aspect of the present disclosure is a fuse sensing circuit which senses a fuse state based on a discharging of capacitors.

Another aspect of the present disclosure is a method for implementing a fuse sensing circuit which senses a fuse state based on a discharging of capacitors.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: a sense input terminal; a sense output terminal; and first and second capacitors that are configured to charge and discharge based on the sense input terminal, wherein the first and second capacitors are further configured to discharge current to a fuse unit cell, and the sense output terminal is configured to indicate a fuse state of the fuse unit cell based on the discharging of the first and second capacitors.

Aspects include the indicated fuse state being based on a discharge rate difference between the discharging of the first capacitor and the discharging of the second capacitor. Other aspects include the indicated fuse state being unblown when a first discharge rate of the first capacitor is less than a second discharge rate of the second capacitor, and the indicated fuse state being blown when the first discharge rate is greater than the second discharge rate.

Additional aspects include a circuit with: a flip-flop having a clock input terminal, a non-clock input terminal, and the sense output terminal; a first inverter having a first inverter input terminal and a first inverter output terminal; and a second inverter having a second inverter input terminal and a second inverter output terminal, wherein the first inverter input terminal is coupled to the first capacitor, the second inverter input terminal is coupled to the second capacitor, the first inverter output terminal is coupled to the clock input terminal, and the second inverter output terminal is coupled to the non-clock input terminal. Certain aspects include a circuit with: a first pass-gate circuit having a first pass-gate input terminal and a first pass-gate output terminal; and a second pass-gate circuit having a second pass-gate input terminal and a second pass-gate output terminal, wherein the first pass-gate output terminal is coupled to a reference resistor of the fuse unit cell during a sensing period of the fuse unit cell, and the second pass-gate output terminal is coupled to a fuse of the fuse unit cell during the sensing period. Some aspects include the first capacitor being configured to discharge current to a ground rail through the reference resistor and the first pass-gate circuit when the sense input terminal activates the first pass-gate circuit, and the second capacitor being configured to discharge current to the ground rail through the fuse and the second pass-gate circuit when the sense input terminal activates the second-pass-gate circuit.

Further aspects include a circuit with: a third pass-gate circuit having a third pass-gate input terminal and a third pass-gate output terminal; and a fourth pass-gate circuit having a fourth pass-gate input terminal and a fourth pass-gate output terminal, wherein the third and fourth pass-gate input terminals are coupled to a power rail, the third pass-gate output terminal is coupled to the first capacitor, and the fourth pass-gate output terminal is coupled to the second capacitor. Various aspects include the third pass-gate output terminal being coupled to the first inverter input terminal, and the fourth pass-gate output terminal being coupled to the second inverter input terminal. Other aspects include the first and second capacitors being further configured to charge based on a falling edge of the sense input terminal, and discharge based on a rising edge of the sense input terminal.

An additional aspect of the present disclosure is a method including: providing a sense input terminal; providing a sense output terminal; and providing first and second capacitors that are configured to charge and discharge based on the sense input terminal, wherein the first and second capacitors are further configured to discharge current to a fuse unit cell, and the sense output terminal is configured to indicate a fuse state of the fuse unit cell based on the discharging of the first and second capacitors.

Aspects include the indicated fuse state being based on a discharge rate difference between the discharging of the first capacitor and the discharging of the second capacitor. Other aspects include the indicated fuse state being unblown when a first discharge rate of the first capacitor is less than a second discharge rate of the second capacitor, and the indicated fuse state being blown when the first discharge rate is greater than the second discharge rate.

Another aspect includes: providing a flip-flop having a clock input terminal, a non-clock input terminal, and the sense output terminal; providing a first inverter having a first inverter input terminal and a first inverter output terminal; providing a second inverter having a second inverter input terminal and a second inverter output terminal; and coupling the first inverter input terminal to the first capacitor, the second inverter input terminal to the second capacitor, the first inverter output terminal to the clock input terminal, and the second inverter output terminal to the non-clock input terminal. Some aspects include: providing a first pass-gate circuit having a first pass-gate input terminal and a first pass-gate output terminal; providing a second pass-gate circuit having a second pass-gate input terminal and a second pass-gate output terminal; and coupling the first pass-gate output terminal to a reference resistor of the fuse unit cell during a sensing period of the fuse unit cell, and the second pass-gate output terminal to a fuse of the fuse unit cell during the sensing period. Various aspects include the first capacitor being further configured to discharge current to a ground rail through the reference resistor and the first pass-gate circuit when the sense input terminal activates the first pass-gate circuit, and the second capacitor being further configured to discharge current to the ground rail through the fuse and the second pass-gate circuit when the sense input terminal activates the second-pass-gate circuit.

Further aspects include: providing a third pass-gate circuit having a third pass-gate input terminal and a third pass-gate output terminal; providing a fourth pass-gate circuit having a fourth pass-gate input terminal and a fourth pass-gate output terminal; and coupling the third and fourth pass-gate input terminals to a power rail, the third pass-gate output terminal to the first capacitor, and the fourth pass-gate output terminal to the second capacitor. Certain aspects include coupling the third pass-gate output terminal to the first inverter input terminal, and the fourth pass-gate output terminal to the second inverter input terminal. Other aspects include the first and second capacitors being further configured to charge based on a falling edge of the sense input terminal, and discharge based on a rising edge of the sense input terminal.

Another aspect of the present disclosure is an electronic fuse sensing circuit with: a sense input terminal; a flip-flop having a clock input terminal, a non-clock input terminal, and a sense output terminal; and first and second capacitors that are configured to charge and discharge based on the sense input terminal, wherein the first and second capacitors are further configured to discharge current to a fuse unit cell during a sensing period of the fuse unit cell, and the sense output terminal is configured to indicate a fuse state of the fuse unit cell based on a discharge rate difference between the discharging of the first capacitor and the discharging of the second capacitor.

Further aspects include an electronic fuse sensing circuit with: a first pass-gate circuit having a first pass-gate input terminal and a first pass-gate output terminal; a second pass-gate circuit having a second pass-gate input terminal and a second pass-gate output terminal; a third pass-gate circuit having a third pass-gate input terminal and a third pass-gate output terminal; and a fourth pass-gate circuit having a fourth pass-gate input terminal and a fourth pass-gate output terminal, wherein the first pass-gate input terminal is coupled to the third pass-gate output terminal and the first capacitor, the second pass-gate input terminal is coupled to the fourth pass-gate output terminal and the second capacitor, the first pass-gate output terminal is coupled to a reference resistor of the fuse unit cell during a sensing period of the fuse unit cell, the second pass-gate output terminal is coupled to a fuse of the fuse unit cell during the sensing period, and the third and fourth pass-gate input terminals are coupled to a power rail.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 3 schematically illustrates waveform diagrams with respect to various signals based on a fuse state, in accordance with various exemplary embodiments of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of high power consumption, unnecessary pre-charging, and slow read cycle times. The present disclosure addresses and solves such problems, for instance, by, inter alia, providing a fuse state of a fuse unit cell based on a discharging of capacitors within a fuse sensing circuit that is coupled to the fuse unit cell.

Figure 2:
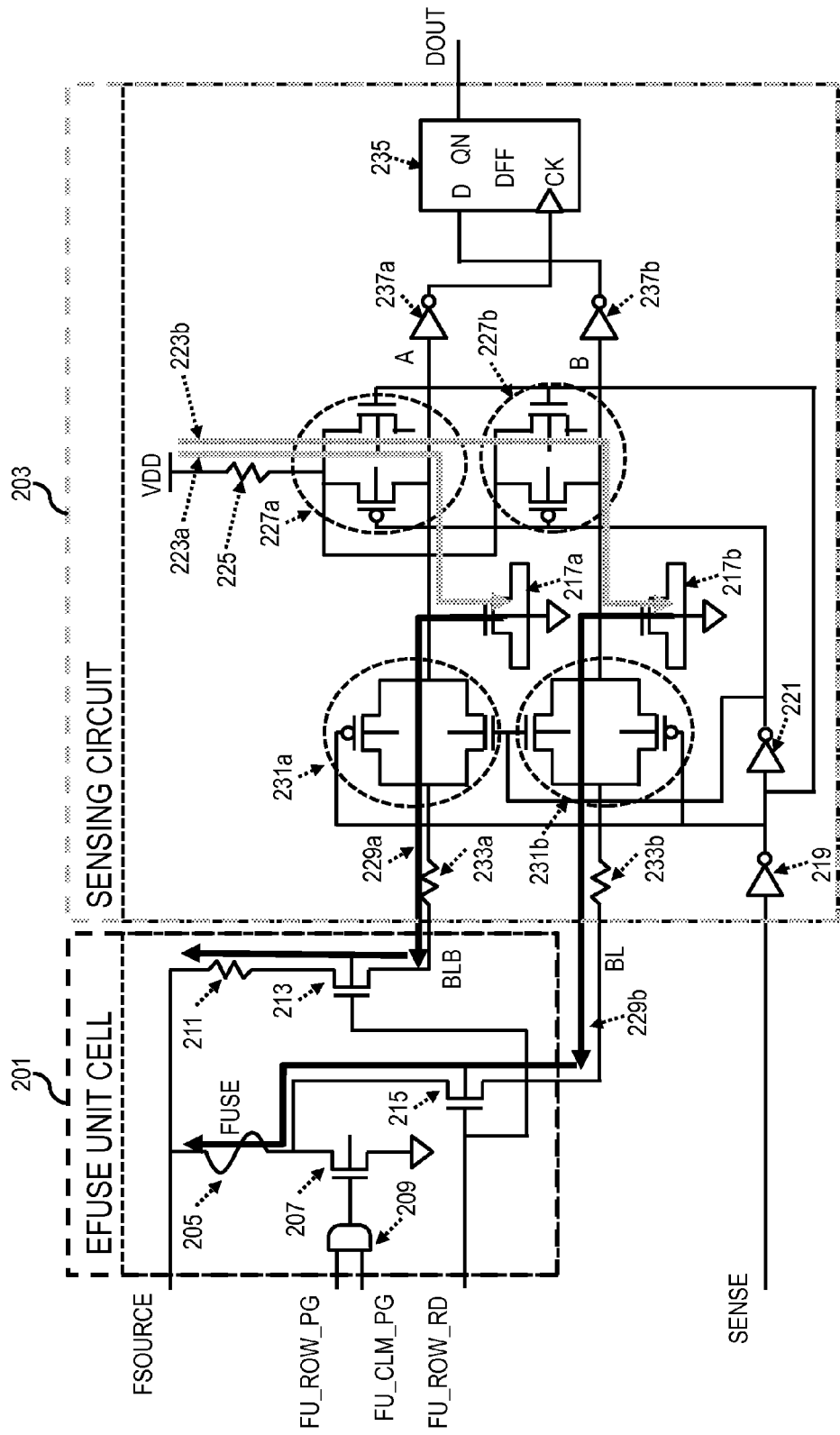
FIG. 2 schematically illustrates a fuse sensing circuit that indicates a fuse state of a fuse unit cell based on a discharging of capacitors of the fuse sensing circuit, in accordance with an exemplary embodiment of the present disclosure.

FIG. 2 schematically illustrates a fuse sensing circuit that indicates a fuse state of a fuse unit cell based on a discharging of capacitors of the fuse sensing circuit, in accordance with an exemplary embodiment of the present disclosure. As shown, the circuit in FIG. 2 includes fuse unit cell 201 coupled to sensing circuit 203. Fuse unit cell 201 includes fuse 205 having one end coupled to a power source (e.g., FSOURCE) and another end coupled to program transistor 207. For example, while program transistor 207 is activated (e.g., based on inputs, FU_ROW_PG and FU_CLM_PG, to AND gate 209), a large current from FSOURCE may go through fuse unit cell 201, causing fuse 205 to become blown. To detect the fuse state (e.g., blown, unblown, etc.) of fuse 205, fuse unit cell 201 includes reference resistor 211 along with transistors 213 and 215 that are connected to sensing circuit 203.

Sensing circuit 203 includes two capacitors 217a and 217b that charge and discharge based on a sense input terminal of the sensing circuit 203 (e.g., based on the SENSE and inverted SENSE input signals at inverters 219 and 221, respectively). As shown, current from a power rail charges capacitor 217a through charge path 223a (e.g., that includes resistor 225 and pass-gate 227a) and capacitor 217b through charge path 223b (e.g., that includes resistor 225 and pass-gate 227b) when their respective pass-gates 227a and 227b are activated (e.g., SENSE="0"). In addition, capacitor 217a discharges current to fuse unit cell 201 (e.g., at its inverted/reference bitline (BLB)) through discharge path 229a (e.g., that includes pass-gate 231a and resistor 233a), and capacitor 217b discharges current to fuse unit cell 201 (e.g., at its bitline (BL)) through discharge path 229b (e.g., that includes pass-gate 231b and resistor 233b) when their respective pass-gates 231a and 231b are activated (e.g., SENSE="1").

By way of example, at SENSE falling edge, the two capacitors 217a and 217b may start to charge. At SENSE rising edge, the two capacitors 217a and 217b may stop charging, and start to discharge. In sense mode, FSOURCE may be fixed to a ground rail, and program transistor 207 may be switched off. If, for instance, FU_ROW_RD is selected, transistors 213 and 215 will be switched on. Thus, when pass-gates 229a and 229b are activated, current will discharge from capacitor 217a to the ground rail through transistor 213 and reference resistor 211, and from capacitor 217b to the ground rail through transistor 215 and fuse 205. In one scenario, the resistance of reference resistor 211 may be 1.4 kiloohms, the resistance of unblown fuse 205 may be 140 ohms, and the resistance of blown fuse 205 may be 5 kiloohms. As such, regardless of the state of fuse 205 (e.g., blown, unblown, etc.), the discharging rates with respect to the currents from capacitors 217a and 217b will not be the same and, thus, there will be a timing skew between the clock input and the D input at flip-flop 235 (e.g., based on inputs received at inverter 237a and 237b). For example, the rise of the D input will occur before the rise of the clock input when fuse 205 is unblown (e.g., causing DOUT to be "0"), and the rise of the clock input will occur before the rise of the D input when fuse 205 is blown (e.g., causing DOUT to be "1"). In this way, the fuse state of fuse unit cell 201 (and fuse 205) may be ascertained regardless of whether fuse 205 is blown or unblown.

Figure 1:
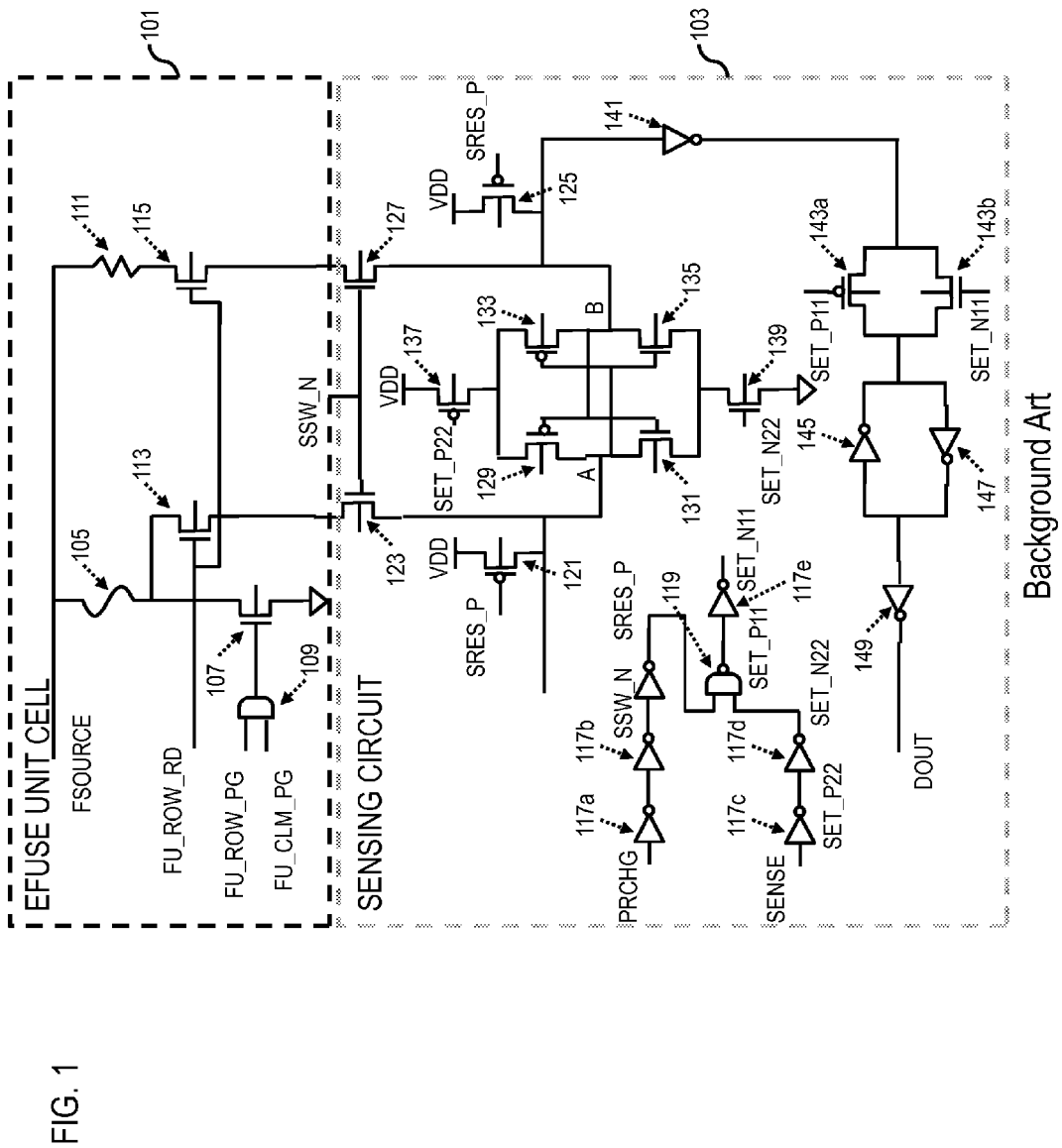
FIG. 1 schematically illustrates a traditional sensing circuit with an eFuse unit cell.

In addition, compared with the traditional circuit in FIG. 1, the circuit in FIG. 2 may significantly reduce power consumption as a result of decreases in the minimum sensing supply voltage and the sensing current (e.g., there may only be transient current at sense clock's rising edge and falling edge). Furthermore, the circuit in FIG. 2 may increase read cycle times since read frequency can be increased (e.g., no need for unnecessary pre-charging), and reduce chip area requirements for sensing purposes (e.g., no need for additional pre-charge pins).

FIG. 3 schematically illustrates waveform diagrams of various signals based on a fuse state, in accordance with various exemplary embodiments of the present disclosure. For example, diagrams 301 and 303 may reflect signals with respect to the circuit of FIG. 2, where diagram 301 depicts a scenario with fuse 205 being unblown, and diagram 303 depicts a scenario with fuse 205 being blown. In the scenario associated with diagram 301, capacitors 217a and 217b may start to discharge as a result of the rising edge of the sense input, SENSE, at time 305. Because the resistance of unblown fuse 205 is less than the resistance of reference resistor 211, the discharge rate of capacitor 217a is less than the discharge rate of capacitor 217b (e.g., as illustrated by signals A and B). Thus, the rise of the D input at flip-flop 235 will occur before the rise of the clock input at flip-flop 235 (e.g., the rise of the clock input will occur at time 307). Consequently, the DOUT signal (e.g., the sense output signal) will be "0," indicating that the fuse state of fuse unit cell 201 is unblown.

Similarly, in the scenario associated with diagram 303, capacitors 217a and 217b may start to discharge as a result of the rising edge of the sense input, SENSE, at time 309. However, because the resistance of blown fuse 205 is greater than the resistance of reference resistor 211, the rise of the clock input at flip-flop 235 will occur before the rise of the D input at flip-flop 235 (e.g., the rise of the clock input will occur at time 311). Accordingly, the DOUT signal will be "1," indicating that the fuse state of fuse unit cell 201 is blown. In addition, as shown in diagrams 301 and 303, the timing skews between the D input and the clock input may vary (e.g., having timing skews of 125 ps and 260 ps, respectively). Nonetheless, the reliability and the accuracy of the indicated fuse state may remain unaffected by such variations (e.g., the indicated fuse state may be detected even when timing skews of as little as 20 ps). Therefore, as compared with the traditional circuit of FIG. 1, variations of process, voltage, temperature, etc., may not have as much effect on embodiments of the present disclosure.

The embodiments of the present disclosure can achieve several technical effects, including power consumption efficiency, smaller device sizes, and faster read cycle times. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any other devices utilizing logic or high-voltage technology nodes. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
   a sense input terminal;
   a sense output terminal;
   first and second capacitors that are configured to charge and discharge based on the sense input terminal, wherein the first and second capacitors are further configured to discharge current to a fuse unit cell, and the sense output terminal is configured to indicate a fuse state of the fuse unit cell based on the discharging of the first and second capacitors;
   a first pass-gate circuit having a first pass-gate input terminal and a first pass-gate output terminal; and
   a second pass-gate circuit having a second pass-gate input terminal and a second pass-gate output terminal, wherein the first pass-gate output terminal is coupled to a reference resistor of the fuse unit cell during a sensing period of the fuse unit cell, and the second pass-gate output terminal is coupled to a fuse of the fuse unit cell during the sensing period.

2. The circuit according to claim 1, wherein the indicated fuse state is based on a discharge rate difference between the discharging of the first capacitor and the discharging of the second capacitor.

3. The circuit according to claim 1, wherein the indicated fuse state is unblown when a first discharge rate of the first capacitor is less than a second discharge rate of the second capacitor, and the indicated fuse state is blown when the first discharge rate is greater than the second discharge rate.

4. The circuit according to claim 1, further comprising:
   a flip-flop having a clock input terminal, a non-clock input terminal, and the sense output terminal;
   a first inverter having a first inverter input terminal and a first inverter output terminal; and
   a second inverter having a second inverter input terminal and a second inverter output terminal, wherein the first inverter input terminal is coupled to the first capacitor, the second inverter input terminal is coupled to the second capacitor, the first inverter output terminal is coupled to the clock input terminal, and the second inverter output terminal is coupled to the non-clock input terminal.

5. The circuit according to claim 1, wherein the first capacitor is further configured to discharge current to a ground rail through the reference resistor and the first pass-gate circuit when the sense input terminal activates the first pass-gate circuit, and the second capacitor is further configured to discharge current to the ground rail through the fuse and the second pass-gate circuit when the sense input terminal activates the second-pass-gate circuit.

6. The circuit according to claim 1, further comprising:
   a third pass-gate circuit having a third pass-gate input terminal and a third pass-gate output terminal; and
   a fourth pass-gate circuit having a fourth pass-gate input terminal and a fourth pass-gate output terminal, wherein the third and fourth pass-gate input terminals are coupled to a power rail, the third pass-gate output terminal is coupled to the first capacitor, and the fourth pass-gate output terminal is coupled to the second capacitor.

7. The circuit according to claim 6, wherein the third pass-gate output terminal is coupled to the first inverter input terminal, and the fourth pass-gate output terminal is coupled to the second inverter input terminal.

8. The circuit according to claim 1, wherein the first and second capacitor are further configured to charge based on a falling edge of the sense input terminal, and discharge based on a rising edge of the sense input terminal.

9. A method comprising:
   providing a sense input terminal;
   providing a sense output terminal;
   providing first and second capacitors that are configured to charge and discharge based on the sense input terminal, wherein the first and second capacitors are further configured to discharge current to a fuse unit cell, and the sense output terminal is configured to indicate a fuse state of the fuse unit cell based on the discharging of the first and second capacitors;
   providing a first pass-gate circuit having a first pass-gate input terminal and a first pass-gate output terminal;
   providing a second pass-gate circuit having a second pass-gate input terminal and a second pass-gate output terminal; and
   coupling the first pass-gate output terminal to a reference resistor of the fuse unit cell during a sensing period of the fuse unit cell, and the second pass-gate output terminal to a fuse of the fuse unit cell during the sensing period.

10. The method according to claim 9, wherein the indicated fuse state is based on a discharge rate difference between the discharging of the first capacitor and the discharging of the second capacitor.

11. The method according to claim 9, wherein the indicated fuse state is unblown when a first discharge rate of the first capacitor is less than a second discharge rate of the second capacitor, and the indicated fuse state is blown when the first discharge rate is greater than the second discharge rate.

12. The method according to claim 9, further comprising:
   providing a flip-flop having a clock input terminal, a non-clock input terminal, and the sense output terminal;
   providing a first inverter having a first inverter input terminal and a first inverter output terminal;
   providing a second inverter having a second inverter input terminal and a second inverter output terminal; and
   coupling the first inverter input terminal to the first capacitor, the second inverter input terminal to the second capacitor, the first inverter output terminal to the clock input terminal, and the second inverter output terminal to the non-clock input terminal.

13. The method according to claim 9, wherein the first capacitor is further configured to discharge current to a ground rail through the reference resistor and the first pass-gate circuit when the sense input terminal activates the first pass-gate circuit, and the second capacitor is further configured to discharge current to the ground rail through the fuse and the second pass-gate circuit when the sense input terminal activates the second-pass-gate circuit.

14. The method according to claim 9, further comprising:
   providing a third pass-gate circuit having a third pass-gate input terminal and a third pass-gate output terminal;
   providing a fourth pass-gate circuit having a fourth pass-gate input terminal and a fourth pass-gate output terminal; and coupling the third and fourth pass-gate input terminals to a power rail, the third pass-gate output terminal to the first capacitor, and the fourth pass-gate output terminal to the second capacitor.

15. The method according to claim 14, further comprising: coupling the third pass-gate output terminal to the first inverter input terminal, and the fourth pass-gate output terminal to the second inverter input terminal.

16. The method according to claim 9, wherein the first and second capacitors are further configured to charge based on a falling edge of the sense input terminal, and discharge based on a rising edge of the sense input terminal.

17. An electronic fuse sensing circuit comprising:
a sense input terminal;
a flip-flop having a clock input terminal, a non-clock input terminal, and a sense output terminal;
first and second capacitors that are configured to charge and discharge based on the sense input terminal, wherein the first and second capacitors are further configured to discharge current to a fuse unit cell during a sensing period of the fuse unit cell, and the sense output terminal is configured to indicate a fuse state of the fuse unit cell based on a discharge rate difference between the discharging of the first capacitor and the discharging of the second capacitor;
a first pass-gate circuit having a first pass-gate input terminal and a first pass-gate output terminal;
a second pass-gate circuit having a second pass-gate input terminal and a second pass-gate output terminal;
a third pass-gate circuit having a third pass-gate input terminal and a third pass-gate output terminal; and
a fourth pass-gate circuit having a fourth pass-gate input terminal and a fourth pass-gate output terminal,
wherein the first pass-gate input terminal is coupled to the third pass-gate output terminal and the first capacitor, the second pass-gate input terminal is coupled to the fourth pass-gate output terminal and the second capacitor, the first pass-gate output terminal is coupled to a reference resistor of the fuse unit cell during a sensing period of the fuse unit cell, the second pass-gate output terminal is coupled to a fuse of the fuse unit cell during the sensing period, and the third and fourth pass-gate input terminals are coupled to a power rail.

\* \* \* \* \*